US011963449B2

(12) United States Patent
Noda et al.

(10) Patent No.: US 11,963,449 B2
(45) Date of Patent: Apr. 16, 2024

(54) THERMOELECTRIC CONVERSION ELEMENT AND THERMOELECTRIC CONVERSION DEVICE HAVING THE SAME

(71) Applicant: TDK Corporation, Tokyo (JP)

(72) Inventors: Youhei Noda, Tokyo (JP); Shota Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/639,754

(22) PCT Filed: Oct. 5, 2020

(86) PCT No.: PCT/JP2020/037720
§ 371 (c)(1),
(2) Date: Mar. 2, 2022

(87) PCT Pub. No.: WO2021/085039
PCT Pub. Date: May 6, 2021

(65) Prior Publication Data
US 2022/0336724 A1 Oct. 20, 2022

(30) Foreign Application Priority Data
Oct. 31, 2019 (JP) ................................. 2019-198812

(51) Int. Cl.
H10N 10/17 (2023.01)
(52) U.S. Cl.
CPC .................................. H10N 10/17 (2023.02)
(58) Field of Classification Search
CPC ..................................................... H10N 10/17
See application file for complete search history.

(56) References Cited

U.S. PATENT DOCUMENTS 6,548,750 B1 *   4/2003  Picone ................... H10N 10/13
                                                             136/203
2005/0217714 A1 * 10/2005  Nishijima .............. H10N 10/17
                                                             136/204
(Continued)

FOREIGN PATENT DOCUMENTS

JP       11-177154 A       7/1999
JP      2003-258323 A      9/2003
(Continued)

OTHER PUBLICATIONS

WO 2018105601 A1 Machine translation provided by FIT database, translated on Apr. 20, 2023.*
(Continued)

Primary Examiner — Golam Mowla
(74) Attorney, Agent, or Firm — Rimon, P.C.

(57) ABSTRACT

To increase thermoelectromotive voltage of a thermoelectric conversion element with a magnetization direction, a temperature gradient direction, and an electromotive force direction orthogonal to each other. A thermoelectric conversion element 1 is formed by annularly winding a thermoelectric material which is radially magnetized and circumferentially generates an electromotive force in accordance with a temperature gradient in the axial direction thereof. Thus, the thermoelectric material is wound not linearly but annularly, so that a connection line for connecting a plurality of thermoelectric materials is not necessary. In particular, when the thermoelectric material is wound in a plurality of turns, the length per unit area of the thermoelectric material in the direction of the electromotive force can be significantly increased, making it possible to significantly increase thermoelectromotive voltage while suppressing increase in the size of the element.

9 Claims, 8 Drawing Sheets

(56) References Cited

U.S. PATENT DOCUMENTS

| | | | | |
|---|---|---|---|---|
| 2015/0221849 A1* | 8/2015 | Tamaki | ............... | H10N 10/17 |
| | | | | 136/209 |
| 2015/0380629 A1* | 12/2015 | Kanno | ................ | H10N 10/01 |
| | | | | 438/54 |
| 2016/0172571 A1* | 6/2016 | Leu | .................... | H10N 10/17 |
| | | | | 136/208 |
| 2018/0233648 A1 | 8/2018 | Cho et al. | | |
| 2020/0212282 A1 | 7/2020 | Nakatsuji et al. | | |

FOREIGN PATENT DOCUMENTS

| | | | | |
|---|---|---|---|---|
| JP | 2007-095897 A | 4/2007 | | |
| JP | 2012-069626 A | 4/2012 | | |
| JP | 2014-072256 A | 4/2014 | | |
| JP | 2018-078147 A | 5/2018 | | |
| JP | 2019-500757 A | 1/2019 | | |
| WO | 2009/063805 A1 | 5/2009 | | |
| WO | 2018/105601 A1 | 6/2018 | | |
| WO | 2019/009308 A1 | 1/2019 | | |
| WO | WO-2021085040 A1 * | 5/2021 | ............ | H01L 35/32 |

OTHER PUBLICATIONS

International Search Report issued in corresponding International Patent Application No. PCT/JP2020/037720, dated Nov. 10, 2020, with English translation.

* cited by examiner

| | Pattern Shape | Number of Stacked Layers | Filler | Heat Conductivity of Thermoelectric Material [W/mK] | b/a ratio | Heat Equalizing Layer | Thermoelectric Material | Electromotive Force [mV] |
|---|---|---|---|---|---|---|---|---|
| Example 1 | Spiral | 1 | No | 5 | 0.5 | No | FePt | 0.43 |
| Example 2 | Spiral | 5 | No | 5 | 0.5 | No | FePt | 2.15 |
| Example 3 | Spiral | 5 | Yes | 5 | 0.5 | No | FePt | 2.38 |
| Example 4 | Spiral | 5 | Yes | 30 | 3 | No | FePt | 2.74 |
| Example 5 | Spiral | 5 | Yes | 30 | 3 | Yes | FePt | 3.06 |
| Example 6 | Spiral | 10 | Yes | 30 | 3 | Yes | FePt | 6.71 |
| Example 7 | Spiral | 20 | Yes | 30 | 3 | Yes | FePt | 13.42 |
| Example 8 | Spiral | 2 | Yes | 30 | 1.2 | Yes | Co$_2$MnGa | 10.43 |
| Example 9 | Spiral | 4 | Yes | 30 | 1.2 | Yes | Co$_2$MnGa | 20.58 |
| Example 10 | Linear | 5 | Yes | 30 | 3 | Yes | FePt | 0.27 |
| Example 11 | Linear | 10 | Yes | 30 | 3 | Yes | FePt | 0.54 |
| Example 12 | Linear | 15 | Yes | 30 | 3 | Yes | FePt | 0.81 |

FIG. 10

US 11,963,449 B2

THERMOELECTRIC CONVERSION ELEMENT AND THERMOELECTRIC CONVERSION DEVICE HAVING THE SAME

CROSS REFERENCE TO RELATED APPLICATIONS

This application is the U.S. National Phase under 35 U.S.C. § 371 of International Application No. PCT/JP2020/037720, filed on Oct. 5, 2020, which claims the benefit of Japanese Application No. 2019-198812, filed on Oct. 31, 2019, the entire contents of each are hereby incorporated by reference.

TECHNICAL FIELD

The present invention relates to a thermoelectric conversion element and a thermoelectric conversion device having the same and, more particularly, to a thermoelectric conversion element with a magnetization direction, a temperature gradient direction, and an electromotive force direction mutually orthogonal and a thermoelectric conversion device having such a thermoelectric conversion element.

BACKGROUND ART

Energy problems are big challenges facing humanity, and there has been strongly demanded a technology for converting energy existing in the environment into electric power. In particular, to achieve an IoT (Internet of Things) society, it is significantly necessary to ensure power supply sources for various devices. From this point of view, there is highly desired a technology that uses energy existing in the environment, such as a temperature gradient, as a power supply source. As a thermoelectric conversion element that generates power by using a temperature gradient, there are known one that uses a Seebeck effect and one that uses a Nernst effect.

The Nernst effect is a phenomenon in which, when a magnetic field is applied in a direction crossing (preferably, at right angle) a temperature gradient direction (heat flow direction) in a state where a temperature gradient is generated in a conductor, an electromotive force occurs in a direction orthogonal to both a temperature gradient direction and a magnetic field direction. The Nernst effect is said to be more efficient than the Seebeck effect theoretically. Actually, the fact that an Ettinghausen effect, which is a reverse process of the Nernst effect, achieves efficiency that exceeds the Peltier effect, which is a reverse process of the Seebeck effect, proves the high efficiency of the Nernst effect. However, a strong magnetic field is required to develop the Nernst effect, which is a large obstacle to practical use of a thermoelectric conversion element using the Nernst effect and to studies thereof.

Under such a circumstance, an anomalous Nernst effect (ANE) that uses not an external magnetic field, but anisotropic magnetization of a material now attracts attention. Although the anomalous Nernst effect is not necessarily uniformly defined, it is defined in the present specification as "a phenomenon in which, when a temperature gradient exists in a direction orthogonal to the magnetization direction of a magnetic body, an electromotive force occurs in a direction orthogonal to both the magnetization direction and temperature gradient direction".

Patent Documents 1 and 2 disclose a thermoelectric conversion element using the anomalous Nernst effect. In the thermoelectric conversion element disclosed in Patent Documents 1 and 2, a plurality of linear patterns made of a thermoelectric material capable of developing the anomalous Nernst effect are arranged on the surface of an insulating layer and mutually connected in series by connection lines so as to accumulate an electromotive force generated in each of the linear patterns. Further, Patent Document 3 discloses a material with a high thermoelectromotive voltage capable of developing the anomalous Nernst effect.

CITATION LIST

Patent Document

[Patent Document 1] JP 2014-072256A
[Patent Document 2] JP 2018-078147A
[Patent Document 3] Pamphlet of WO 2019/009308

SUMMARY OF THE INVENTION

Problem to be Solved by the Invention

However, the thermoelectric conversion elements disclosed in Patent Documents 1 and 2 are disadvantageously low in thermoelectromotive voltage. To increase the thermoelectromotive voltage, it is necessary to increase the total length of the linear patterns made of a thermoelectric material; however, it is difficult to increase the total length of the linear patterns per unit area with the structure described in Patent Documents 1 and 2.

It is therefore an object of the present invention to provide a thermoelectric conversion element with a magnetization direction, a temperature gradient direction, and an electromotive force direction mutually orthogonal, in which thermoelectromotive voltage is increased by increasing the length of a thermoelectric material in the electromotive force direction while increase in the size of the element is suppressed, and a thermoplastic conversion device having such a thermoelectric conversion element.

Means for Solving the Problem

A thermoelectric conversion element according to one aspect of the present invention is formed by annularly winding a thermoelectric material which is radially magnetized and circumferentially generates an electromotive force in accordance with a temperature gradient in the axial direction thereof.

According to the present invention, the thermoelectric material is wound not linearly but annularly, so that a connection line for connecting a plurality of thermoelectric materials is not necessary. In particular, when the thermoelectric material is wound in a plurality of turns, the length per unit area of the thermoelectric material in an electromotive force direction can be significantly increased, making it possible to significantly increase thermoelectromotive voltage while suppressing increase in the size of the element.

In the present invention, the thermoelectric material may constitute first and second spiral turns which are coaxially stacked and wound in opposite directions, and the inner circumferential end of the first spiral turn may be connected to the inner circumferential end of the second spiral turn. According to the configuration in which two spiral patterns are stacked, it is possible to increase thermoelectromotive voltage without increasing the size of the element in a direction perpendicular to a temperature gradient direction. In addition, the inner circumferential ends of the two spiral patterns are mutually connected, thus facilitating connection between the thermoelectric material and a terminal electrode.

A thermoelectric conversion element according to another aspect of the present invention is formed by stacking, through insulating layers, a plurality of wiring layers each including a thermoelectric material with a magnetization direction, a temperature gradient direction, and an electromotive force direction mutually orthogonal, and the thermoelectric materials included in the respective wiring layers are mutually connected in series so as to accumulate an electromotive force.

According to the present invention, since the plurality of wiring layers each including the thermoelectric material are stacked, it is possible to increase thermoelectromotive voltage while suppressing increase in the planar size in a direction perpendicular to the stacking direction.

In the present invention, the plurality of wiring layers may be stacked in the temperature gradient direction and may each include a plurality of linear patterns each made of the thermoelectric material and each extending in the electromotive force direction, and the plurality of linear patterns included in the respective wiring layers may be mutually connected in series in the surfaces of the respective wiring layers and between the wiring layers through a via formed in the insulating layer so as to accumulate the electromotive force. This makes it possible to increase thermoelectromotive voltage while suppressing increase in the planar size in a direction perpendicular to the temperature gradient direction.

The thermoelectric conversion element according to the present invention may further include a filler filled between the thermoelectric materials adjacent in the magnetization direction, having an insulation property, and lower in heat conductivity than the thermoelectric material. This makes most of a heat flow pass the thermoelectric material, allowing higher thermoelectromotive voltage to be obtained. In this case, the heat conductivity of the filler may be lower than that of the insulating layer supporting the thermoelectric material. In this case, assuming that the heat conductivity of the thermoelectric material is "a", and the heat conductivity of the insulating layer is "b", b≥0.8a may be satisfied. This makes it possible to obtain an even higher thermoelectromotive voltage.

The thermoelectric conversion element according to the present invention may further include first and second heat equalizing layers that are provided so as to sandwich the thermoelectric material in the temperature gradient direction and have a heat conductivity higher than that of the insulating layer. This reduces an in-plane temperature difference to further equalize the in-plane distribution of the temperature gradient.

In the present invention, the thermoelectric material may be made of a material having a Weyl point in the vicinity of Fermi energy and exhibiting an anomalous Nernst effect. This makes it possible to obtain an even higher thermoelectromotive voltage.

The thermoelectric conversion element according to the present invention may further include first and second terminal electrodes connected to one end and the other end of the thermoelectric material in the electromotive force direction. This allows a desired circuit to be connected to the first and second terminal electrodes.

A thermoelectric conversion device according to the present invention includes a substrate having first and second wiring patterns and the above-described thermoelectric conversion element, and the first and second wiring patterns are connected respectively to the first and second terminal electrodes. This allows a voltage appearing at the first and second patterns to be utilized by a desired circuit.

Advantageous Effects of the Invention

As described above, according to the present invention, there can be provided a thermoelectric conversion element with a magnetization direction, a temperature gradient direction, and an electromotive force direction mutually orthogonal, in which thermoelectromotive voltage is increased by increasing the length of a thermoelectric material in the electromotive force direction while increase in the size of the element is suppressed, and a thermoplastic conversion device having such a thermoelectric conversion element.

BRIEF DESCRIPTION OF THE DRAWINGS

FIG. 10 is a table showing the configurations and electromotive forces of thermoelectric conversion elements of Examples 1 to 12.

MODE FOR CARRYING OUT THE INVENTION

Hereinafter, preferred embodiments of the present invention will be described in detail with reference to the accompanying drawings.

First Embodiment

Figure 1:
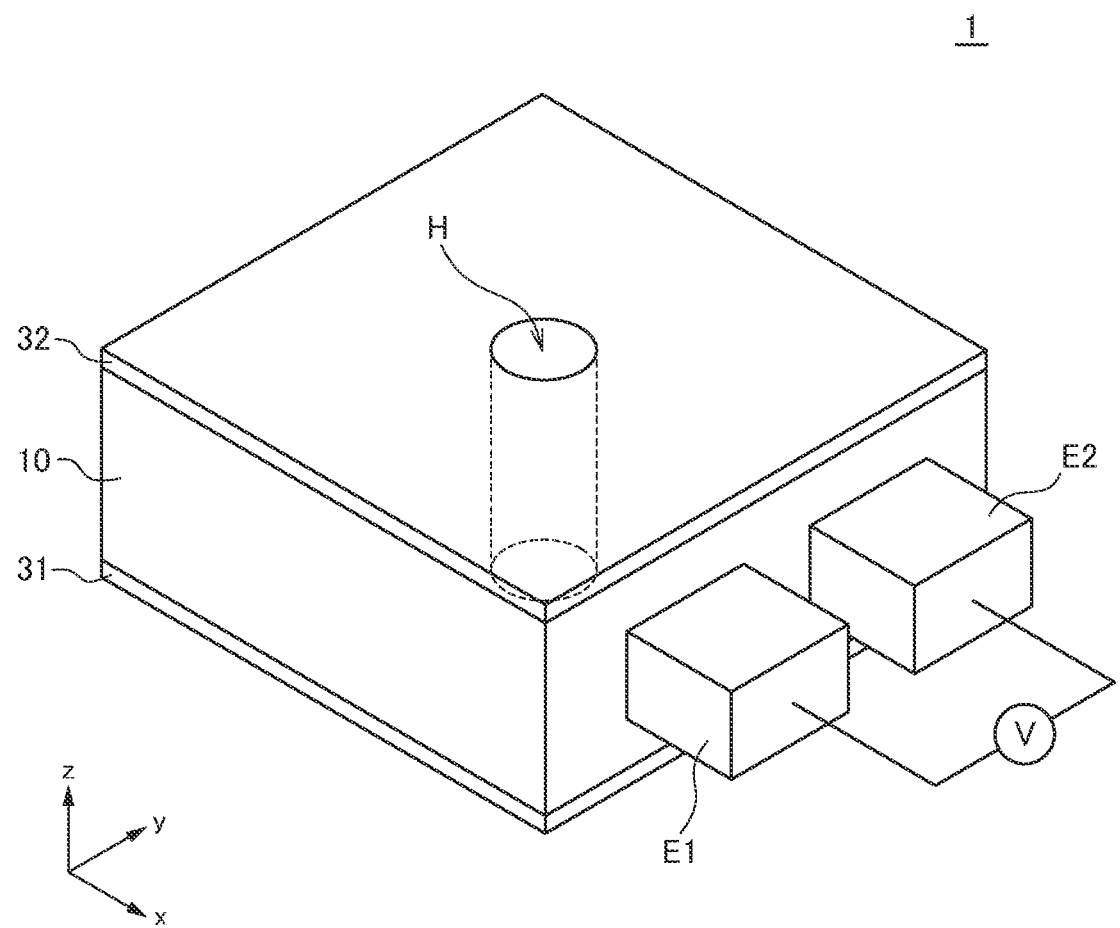
FIG. 1 is a schematic perspective view illustrating the outer appearance of a thermoelectric conversion element 1 according to a first embodiment of the present invention.
Figure 2:
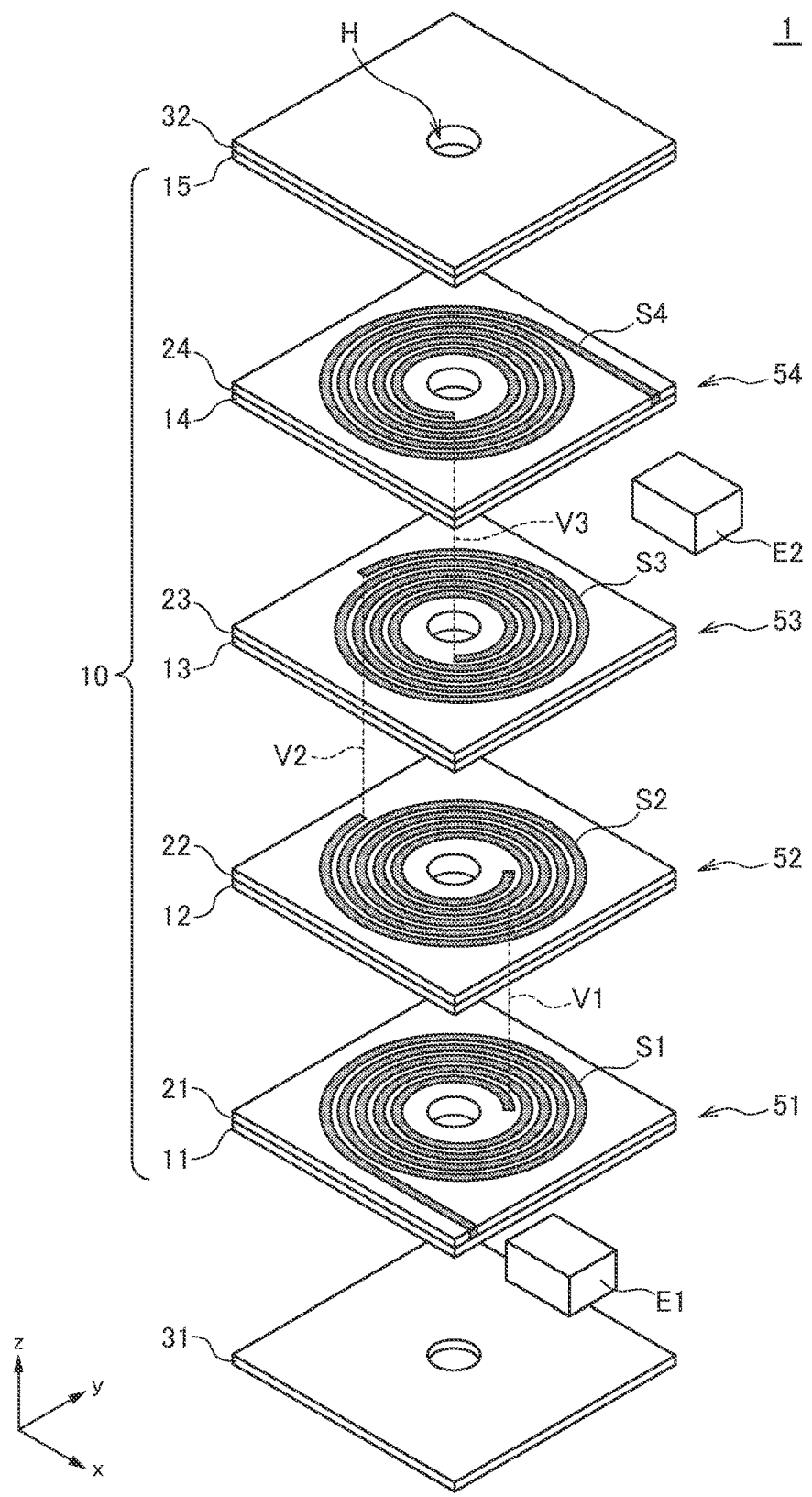
FIG. 2 is a schematic exploded perspective view for explaining the internal structure of the thermoelectric conversion element 1.
Figure 3:
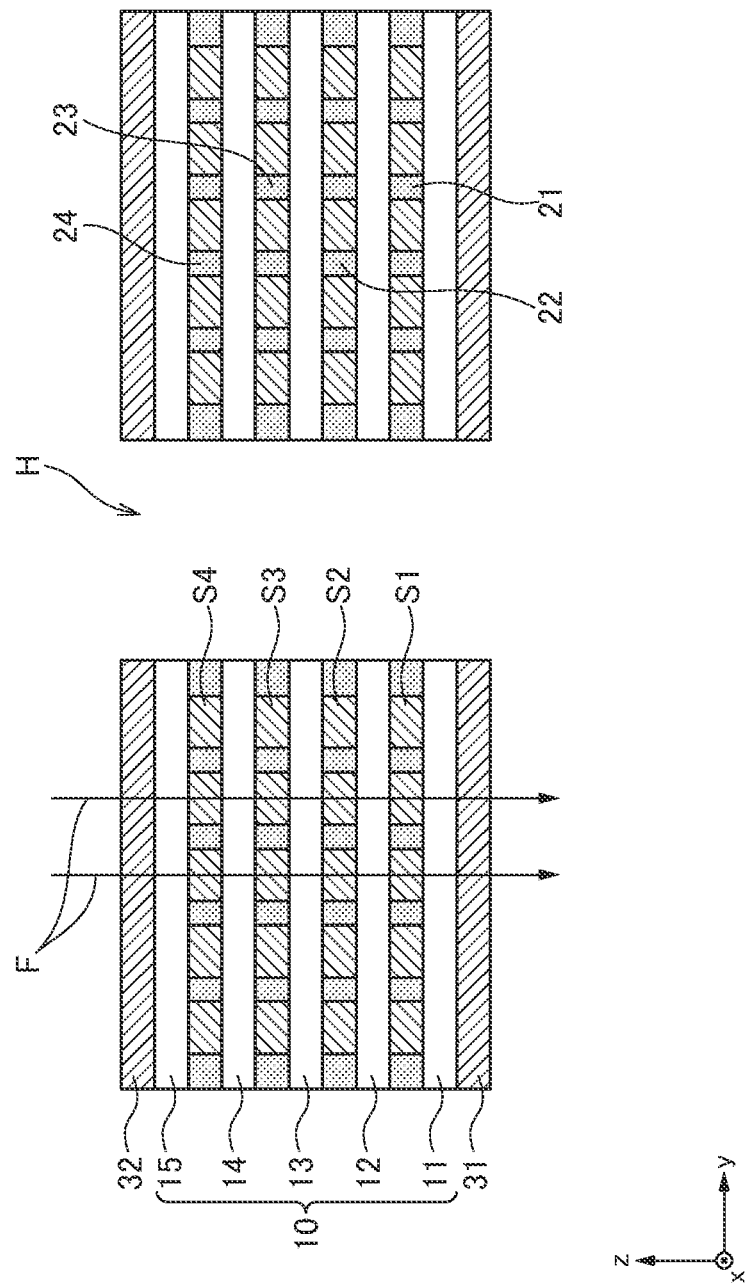
FIG. 3 is a schematic cross-sectional view for explaining the internal structure of the thermoelectric conversion element 1.

FIG. 1 is a schematic perspective view illustrating the outer appearance of a thermoelectric conversion element 1 according to a first embodiment of the present invention. FIGS. 2 and 3 are respectively a schematic exploded perspective view and a schematic cross-sectional view for explaining the internal structure of the thermoelectric conversion element 1.

The thermoelectric conversion element 1 according to the present embodiment is an element that generates a thermoelectromotive voltage based on a temperature gradient in the z-direction and includes, as illustrated in FIGS. 1 to 3, a stacked structure 10, heat equalizing layers 31 and 32 sandwiching the stacked structure 10 in the z-direction, and terminal electrodes E1 and E2 at which a thermoelectromotive voltage appears. The stacked structure 10 and heat equalizing layers 31 and 32 have a through hole H penetrating therethrough in the z-direction. The through hole H may be hollow or filled with resin or the like. The thermoelectric conversion element 1 according to the present embodiment is not particularly limited in application and may be applied to a micro generator device that uses a temperature gradient to generate power or to a heat flow sensor that detects a slight heat flow.

The stacked structure 10 includes insulating layers 11 to 15 made of resin or the like, spiral patterns S1 to S4 made of a thermoelectric material formed respectively on the surfaces of the insulating layers 11 to 14, and fillers 21 to 24 formed respectively on the surfaces of the insulating layers 11 to 14 so as to be filled in areas not covered by the spiral patterns S1 to S4. The spiral patterns S1 to S4 constitute wiring layers 51 to 54, respectively. Thus, the thermoelectric conversion element 1 according to the present embodiment has a structure in which the four wiring layers 51 to 54 are stacked on one another.

The thermoelectric material constituting each of the spiral patterns S1 to S4 is not particularly limited in type as long as a magnetization direction, a temperature gradient direction, and an electromotive force direction thereof are mutually orthogonal and may be a material ($Co_2MnGa$, $Mn_3Sn$, FePt, etc.) having the anomalous Nernst effect or may be a material (YIG/Pt, etc.) having a spin Seebeck effect. Of the materials having the anomalous Nernst effect, FePt has a thermoelectric coefficient of about 1 μV/K, and $Co_2MnGa$ has a thermoelectric coefficient of about 7 μV/K. In particular, when a material having a Weyl point in the vicinity of Fermi energy is used as a material having the anomalous Nernst effect, a larger electromotive force can be obtained.

When the thermoelectric material constituting each of the spiral patterns S1 to S4 has the anomalous Nernst effect, a voltage V to be obtained by a temperature gradient ΔT/t is defined as $V=S_N\Delta T$ (l/t), where "$S_N$" is a Nernst coefficient, "l" is the length of the thermoelectric material in the electromotive force direction, and "t" is the thickness of the thermoelectric material in the temperature gradient direction. Thus, a higher voltage V can be obtained by increasing the length l of the thermoelectric material in the electromotive force direction or reducing the thickness t of the thermoelectric material in the temperature gradient direction. However, the reduction in the thickness of the thermoelectric material in the temperature gradient direction correspondingly reduces a temperature difference ΔT, making it difficult to increase the voltage V by reducing the thickness t of the thermoelectric material in the temperature gradient direction. As a result, it is necessary to increase the length l of the thermoelectric material in the electromotive force direction in order to increase the voltage V.

However, when the length l of the thermoelectric material in the electromotive force direction is linearly increased, the size of the thermoelectric conversion element is disadvantageously increased. Thus, in the thermoelectric conversion element 1 according to the present embodiment, the thermoelectric material is spirally wound in a plurality of turns constituting a planar form, and the plurality of coaxially stacked spiral patterns S1 to S4 are mutually connected in series. This makes it possible to sufficiently increase the length l of the thermoelectric material in the electromotive force direction while suppressing increase in the planar size.

In the present embodiment, the magnetization direction of the spiral patterns S1 to S4 is radial, and an electromotive force circumferentially occurs in accordance with the temperature gradient in the axial direction (z-direction). To radially magnetize the spiral patterns S1 to S4, magnetization is carried out with the inside of the through hole H set to the N pole (or S pole) and the surrounding of each of the spiral patterns S1 to S4 set to the S pole (or N pole).

As illustrated in FIG. 2, the spiral patterns S1 and S3 are wound in the clockwise direction from the outer circumferential end to the inner circumferential end, while the spiral patterns S2 and S4 are wound in the counterclockwise direction from the outer circumferential end to the inner circumferential end. That is, the spiral patterns S1, S3 and spiral patterns S2, S4 are wound in the opposite directions. The inner circumferential ends of the spiral patterns S1 and S2 are connected to each other through a via V1 formed in the insulating layer 12, the outer circumferential ends of the spiral patterns S2 and S3 are connected to each other through a via V2 formed in the insulating layer 13, and the inner circumferential ends of the spiral patterns S3 and S4 are connected to each other through a via V3 formed in the insulating layer 14. The outer circumferential end of the spiral pattern S1 is connected to the terminal electrode E1, and the outer circumferential end of the spiral pattern S4 is connected to the terminal electrode E2. Thus, the spiral patterns S1 to S4 are mutually connected in series between the terminal electrodes E1 and E2.

With this configuration, when a temperature gradient exists in the z-direction, an electromotive force circumferentially occurs in each of the spiral patterns S1 to S4. Since the spiral patterns S1 to S4 are mutually connected in series so as to accumulate the electromotive force, a voltage V higher than that in conventional thermoelectric conversion elements appears between the terminal electrodes E1 and E2.

The fillers 21 to 24 are used for efficiently applying the z-direction temperature gradient to the spiral patterns S1 to S4. Therefore, the heat conductivity of the fillers 21 to 24 is preferably sufficiently low and needs to be lower than that of at least the thermoelectric material constituting the spiral patterns S1 to S4. An example of such a material includes resin such as polyimide. The heat conductivity of polyimide is less than 1 W/mK. The heat conductivity of the spiral patterns S1 to S4 differs depending on the thermoelectric material to be used and is about 1 W/mK to 100 W/mK. For example, the heat conductivity of $Co_2MnGa$ is about 25 W/mK, and that of FePt is about 10 W/mK. Thus, when the fillers 21 to 24 having a low heat conductivity are filled between the thermoelectric materials adjacent in the magnetization direction, most of a heat flow F passes the spiral patterns S1 to S4 in the z-direction as illustrated in FIG. 3, allowing increase in the voltage V.

On the other hand, for the insulating layers 11 to 15, it is preferable to use a material having a sufficiently high heat conductivity so as not to interfere with the heat flow F passing the spiral patterns S1 to S4 in the z-direction. In particular, assuming that the heat conductivity of the thermoelectric material is "a", and the heat conductivity of the insulating layers 11 to 15 is "b", it is preferable to use a material satisfying $b \geq 0.8a$. An example of such a material includes a composite material obtained by adding a filler having a high heat conductivity, such as $Al_2O_3$, to resin. Using such a composite material allows the heat conductivity to be adjusted to about 1 W/mK to 100 W/mK according to the type and filling rate of the filler.

The heat equalizing layers 31 and 32 reduce the temperature difference in the xy plane direction to further equalize the in-plane distribution of the temperature gradient to be applied to the stacked structure 10. As the material of the heat equalizing layers 31 and 32, a metal material having a high heat conductivity, such as Cu, can be used. The heat conductivity of Cu is about 380 W/mK.

As described above, in the thermoelectric conversion element 1 according to the present embodiment, the radially magnetized spiral patterns S1 to S4 made of a thermoelectric material are axially stacked and mutually connected in series so as to accumulate the electromotive force, so that it is possible to increase the voltage V in accordance with the temperature gradient in the z-direction while suppressing increase in the xy plane size.

Figure 4:
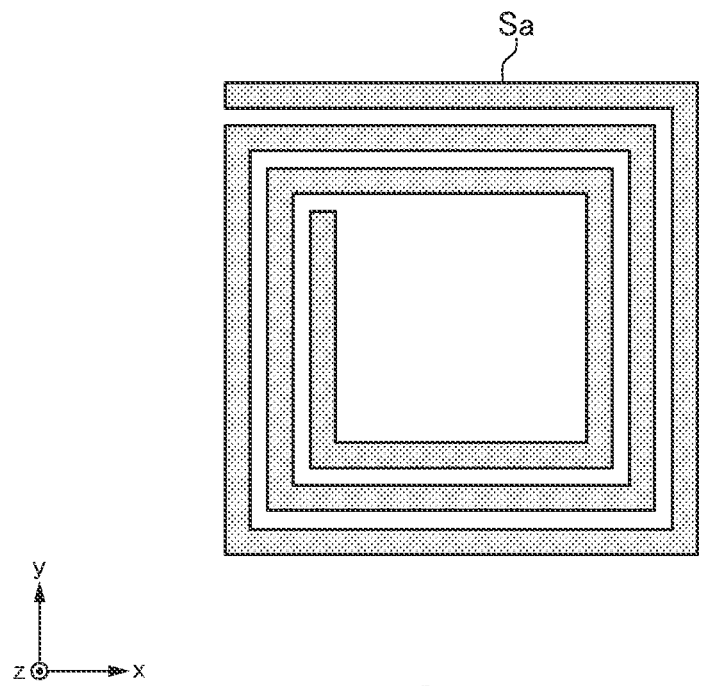
FIG. 4 is a schematic plan view for explaining the pattern shape of a spiral pattern Sa according to a first modification.
Figure 5:
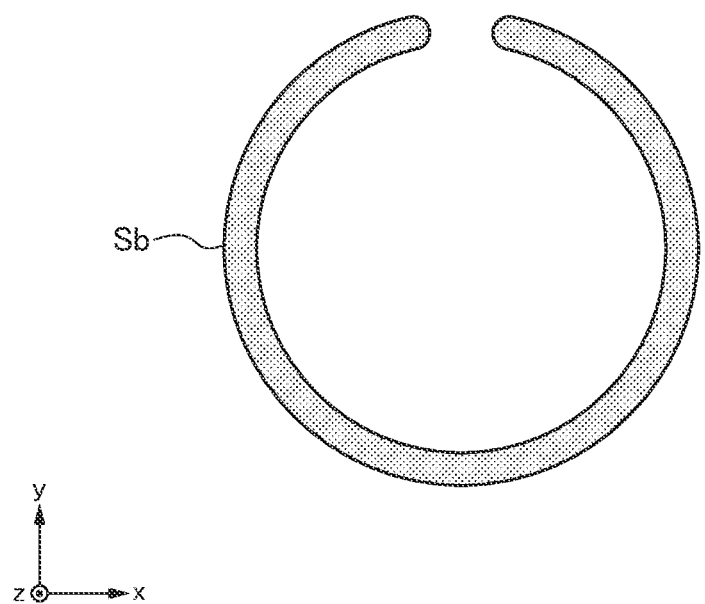
FIG. 5 is a schematic plan view for explaining the pattern shape of a spiral pattern Sb according to a second modification.

The pattern shape of the thermoelectric material is not particularly limited as long as it is annular and may be a rectangular spiral shape obtained by a combination of sections linearly extending in the x-direction and those linearly extending in the y-direction, as exemplified by a spiral pattern Sa illustrated in FIG. 4. Using such a rectangular spiral pattern can make longer the length per unit area of the thermoelectric material in the electromotive force direction. Further, as exemplified by a spiral pattern Sb illustrated in FIG. 5, the number of turns may be one turn or less. The spiral pattern Sb of FIG. 5 is effective when the size of a substrate is so small that it is difficult to spirally wind the thermoelectric material in a plurality of turns. Further, it is not essential to axially stack a plurality of annular patterns, but the number of the layers of the annular patterns to be used may be only one.

Figure 6:
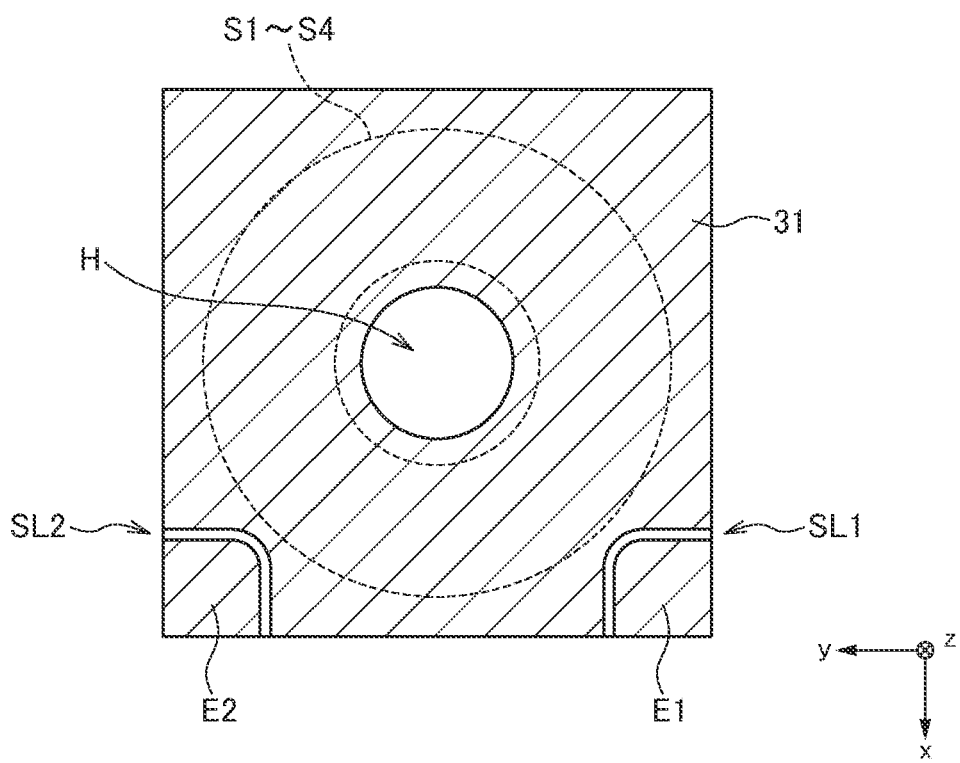
FIG. 6 is a schematic bottom view illustrating an example in which a heat equalizing layer 31 and terminal electrodes E1 and E2 are formed on the same surface.

Further, the positions of the terminal electrodes E1 and E2 are not particularly limited. For example, as illustrated in FIG. 6, the areas defined by slits SL1 and SL2 formed in the heat equalizing layer 31 made of Cu or the like may be used as the terminal electrodes E1 and E2, respectively. In this case, to further equalize the in-plane distribution of the temperature gradient applied to the spiral patterns S1 to S4, it is preferable to form the slits SL1 and SL2 in positions not overlapping the formation areas of the spiral patterns S1 to S4 in a plan view.

Figure 7:
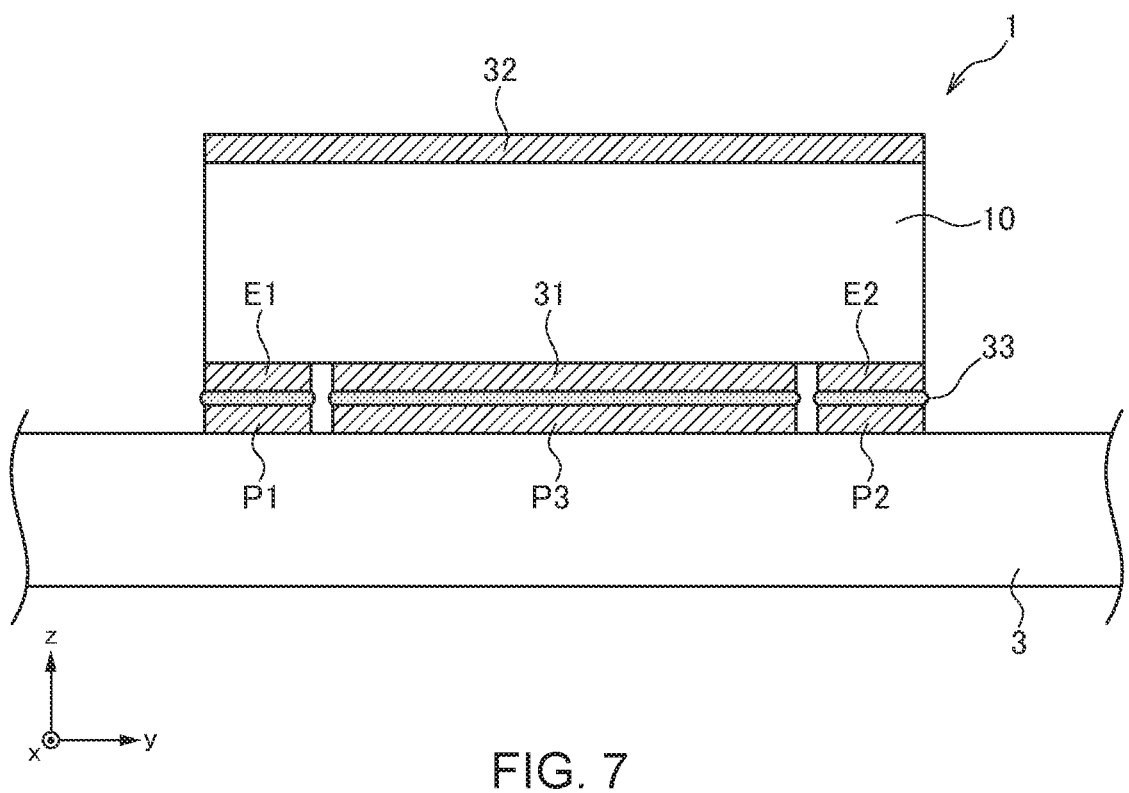
FIG. 7 is a schematic partial cross-sectional view of a thermoelectric conversion device having the thermoelectric conversion element 1.

By thus using a part of the heat equalizing layer 31 as the terminal electrodes E1 and E2, the thermoelectric conversion element 1 can be surface-mounted on a substrate 3 of a thermoelectric conversion device, as illustrated in FIG. 7. In the example of FIG. 7, land patterns P1 to P3 are formed on the surface of the substrate 3, and the terminal electrodes E1, E2 and heat equalizing layer 31 are connected respectively to the land patterns P1 to P3 through a solder 33. This allows heat from the substrate 3 to be efficiently transmitted to the stacked structure through the heat equalizing layer 31, which in turn allows the heat from the substrate 3 to be efficiently converted into electric power.

Second Embodiment

Figure 8:
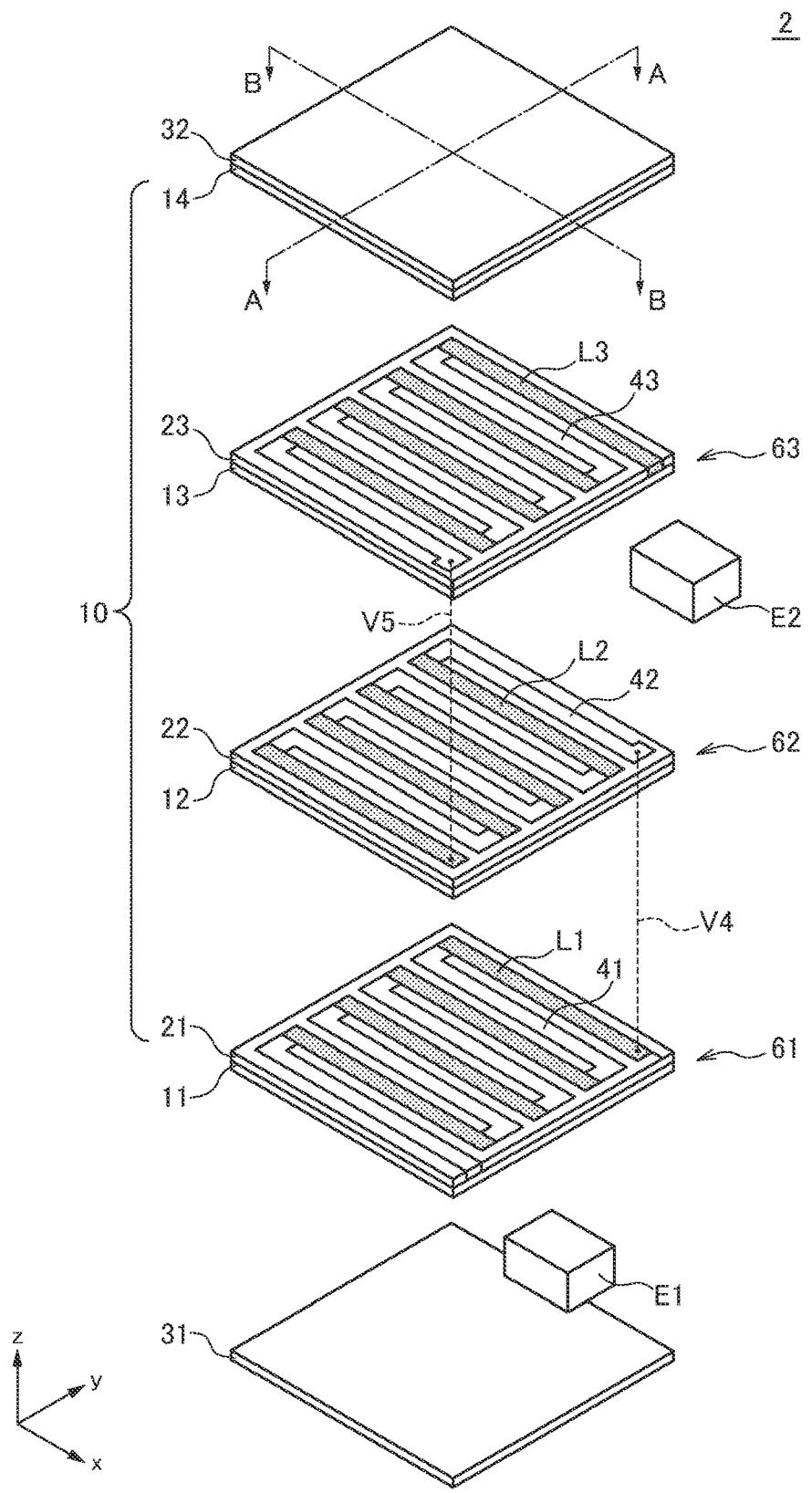
FIG. 8 is a schematic exploded perspective view for explaining the internal structure of a thermoelectric conversion element 2 according to a second embodiment of the present invention.
Figure 9A:
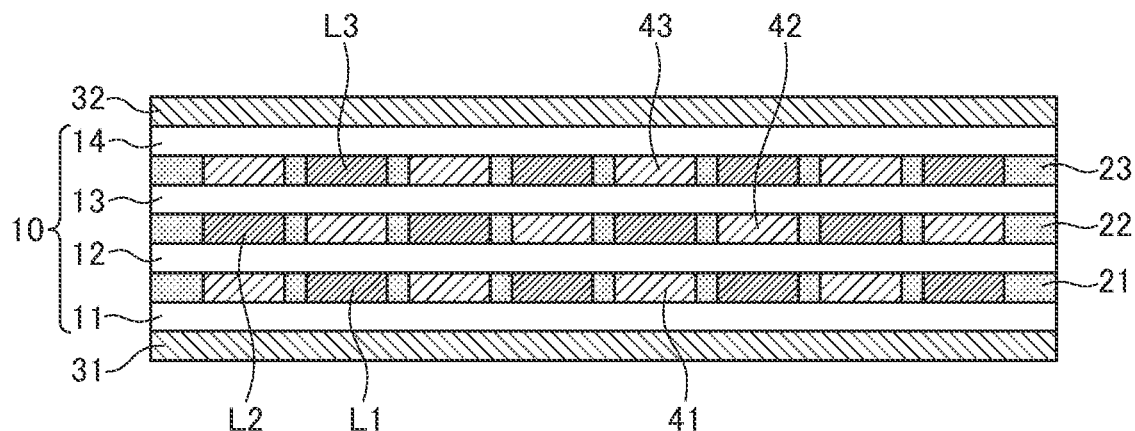
FIG. 9A is a schematic cross-sectional view taken along the line A-A in FIG. 8.

FIG. 8 is a schematic exploded perspective view for explaining the internal structure of a thermoelectric conversion element 2 according to a second embodiment of the present invention. FIG. 9A is a schematic cross-sectional view taken along the line A-A in FIG. 8, and FIG. 9B is a schematic cross-sectional view taken along the line B-B in FIG. 8.

Figure 9B:
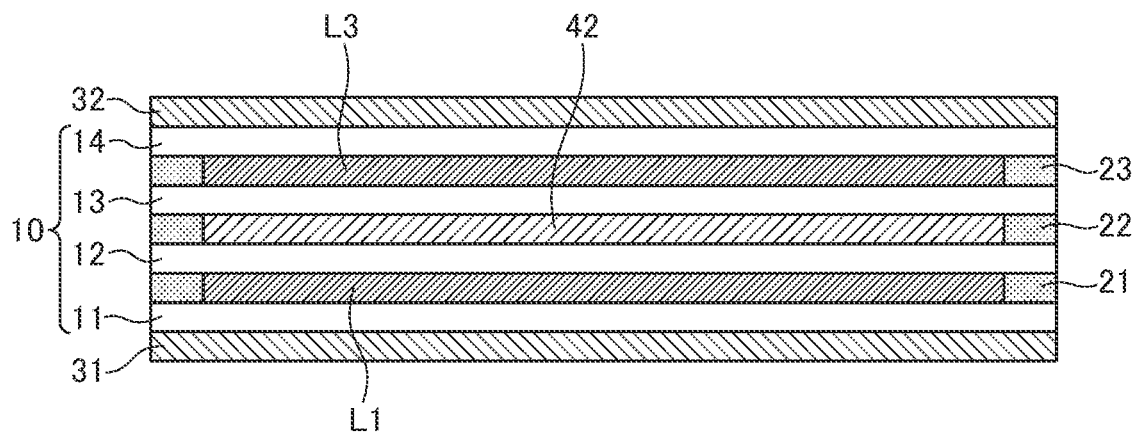
FIG. 9B is a schematic cross-sectional view taken along the line B-B in FIG. 8.

As illustrated in FIG. 8 and FIGS. 9A and 9B, the thermoelectric conversion element 2 according to the present embodiment differs from the thermoelectric conversion element 1 according to the first embodiment in the internal structure of the stacked structure 10. Other basic configurations are the same as those of the thermoelectric conversion element 1 according to the first embodiment, so the same reference numerals are given to the same elements, and overlapping description will be omitted.

In the present embodiment, linear patterns L1 made of a thermoelectric material and connection lines 41 are formed on the surface of the insulating layer 11, linear patterns L2 made of a thermoelectric material and connection lines 42 are formed on the surface of the insulating layer 12, and linear patterns L3 made of a thermoelectric material and connection lines 43 are formed on the surface of the insulating layer 13. The connection lines 41 to 43 are each made of a good conductor such as Cu. The fillers 21 to 23 are filled in respective areas on the surfaces of the insulating layers 11 to 13 that are not covered by the linear patterns L1 to L3 or connection lines 41 to 43. The linear patterns L1 and connection lines 41 constitute a first wiring layer 61, the linear patterns L2 and connection lines 42 constitute a second wiring layer 62, and the linear patterns L3 and connection lines 43 constitute a third wiring layer 63. Thus, the thermoelectric conversion element 2 according to the present embodiment has a structure in which three wiring layers 61 to 63 are stacked on one another.

The linear patterns L1 to L3 extend in the x-direction and are magnetized in the y-direction. Thus, when a temperature gradient exists in the z-direction, an electromotive force occurs in the x-direction in each of the linear patterns L1 to L3. The plurality of linear patterns L1 are mutually connected in series by the connection lines 41 so as to accumulate the electromotive force, the plurality of linear patterns L2 are mutually connected in series by the connection lines 42 so as to accumulate the electromotive force, and the plurality of linear patterns L3 are mutually connected in series by the connection lines 43 so as to accumulate the electromotive force. Further, one end of the linear pattern L1 positioned at one end portion of the first wiring layer 61 is connected to one end of the connection line 42 positioned at one end portion of the second wiring layer 62 through a via V4 formed in the insulating layer 12, and one end of the linear pattern L2 positioned at one end portion of the second wiring layer 62 is connected to one end of the connection line 43 positioned at one end portion of the third wiring layer 63 through a via V5 formed in the insulating layer 13. One end of the connection line 41 positioned at one end portion of the first wiring layer 61 is connected to the terminal electrode E1, and one end of the linear pattern L3 positioned at one end portion of the third wiring layer 63 is connected to the terminal electrode E2. As a result, the linear patterns L1 to L3 are mutually connected in series between the terminal electrodes E1 and E2.

Thus, when a temperature gradient exists in the z-direction, an electromotive force occurs in the x-direction in each of the linear patterns L1 to L3, and the linear patterns L1 to L3 are mutually connected in series so as to accumulate the electromotive force, so that a voltage V higher than that in conventional thermoelectric conversion elements appears between the terminal electrodes E1 and E2.

As described above, in the present embodiment, the connection lines 41 to 43 are used to change the direction of current in opposite directions so as to accumulate the electromotive force generated in each of the plurality of linear patterns L1 to L3, whereby the linear patterns L1 to L3 are mutually connected in series in the surfaces of the respective wiring layers and between the wiring layers. This makes it possible to increase the voltage V in accordance with the temperature gradient in the z-direction while suppressing increase in the size of the xy plane.

While the preferred embodiment of the present invention has been described, the present invention is not limited to the above embodiment, and various modifications may be made within the scope of the present invention, and all such modifications are included in the present invention.

EXAMPLES

FIG. 10 is a table showing the configurations and electromotive forces of thermoelectric conversion elements of Examples 1 to 12.

Example 1

A thermoelectric conversion element including only the insulating layer 11 and spiral pattern S1 illustrated in FIG. 2 was produced. FePt having a thickness of 20 μm was used as the thermoelectric material and wound in a plurality of turns on the insulating layer 11 having an area of 1 cm² to make the circumferential length of the thermoelectric material be 15.69 cm. The radial pattern width of the spiral pattern was 200 μm, and the radial pattern interval between adjacent patterns was 300 μm. The diameter of the through hole H was 2 mm. The heat conductivity of the thermoelectric material was 10 W/mK, and that of the insulating layer was 5 W/mK. A temperature gradient of 50° C./cm was applied in the z-direction to the thus configured thermoelectric conversion element of Example 1, and voltage appearing at both ends of the spiral pattern was measured. As a result, obtained voltage was 0.43 mV.

Example 2

There was produced a thermoelectric conversion element of Example 2 that has the same structure as that of Example 1 except that five spiral pattern layers were stacked through the insulating layers to constitute a stacked structure and mutually connected in series, and voltage was measured in the same conditions. As a result, obtained voltage was 2.15 mV, which was about five times the voltage obtained in Example 1.

Example 3

There was produced a thermoelectric conversion element of Example 3 that has the same structure as that of Example 2 except that a filler was filled in the surface of each insulating layer, and voltage was measured in the same conditions. The heat conductivity of the filler was 0.3 W/mK. As a result, obtained voltage was 2.38 mV, which was higher than the voltage obtained in Example 2.

Example 4

There was produced a thermoelectric conversion element of Example 4 that has the same structure as that of Example 3 except that a material having a heat conductivity of 30 W/mK was used for the insulating layer, and voltage was measured in the same conditions. As a result, obtained voltage was 2.74 mV, which was higher than the voltage obtained in Example 3.

Example 5

There was produced a thermoelectric conversion element of Example 5 that has the same structure as that of Example 4 except that a heat equalizing layer made of Cu was formed on axial both surfaces of the stacked structure, and voltage was measured in the same conditions. As a result, obtained voltage was 3.06 mV, which was higher than the voltage obtained in Example 4.

Example 6

There was produced a thermoelectric conversion element of Example 6 that has the same structure as that of Example 5 except that the spiral patterns and fillers were stacked in 10 layers through the insulating layers and that the spiral patterns were mutually connected in series, and voltage was measured in the same conditions. As a result, obtained voltage was 6.71 mV, which was double or more the voltage obtained in Example 5.

Example 7

There was produced a thermoelectric conversion element of Example 7 that has that has the same structure as that of Example 6 except that the spiral patterns and fillers were stacked in 20 layers through the insulating layers and that the spiral patterns were mutually connected in series, and voltage was measured in the same conditions. As a result, obtained voltage was 13.42 mV, which was about double the voltage obtained in Example 6.

Example 8

There was produced a thermoelectric conversion element of Example 8 having that has the same structure as those of Examples 6 and 7 except that $Co_2MnGa$ was used as the thermoelectric material and that the number of stacked layers was two, and voltage was measured in the same conditions. The heat conductivity of $Co_2MnGa$ is 25 W/mK. As a result, obtained voltage was 10.43 mV, which was high for the number of stacked layers.

Example 9

There was produced a thermoelectric conversion element of Example 9 having the same structure as that of Example 8 except that the number of stacked layers was four, and voltage was measured in the same conditions. As a result, obtained voltage was 20.58 mV which was about double the voltage obtained in Example 8.

Example 10

There was produced a thermoelectric conversion element of Example 11 that has the same structure as that of Example 5 except that the number of the wiring layers 61 to 63 illustrated in FIG. 8 was increased to five and that the total length of the line patterns per layer was set to 15.69 cm as in Examples 1 to 9, and voltage was measured in the same conditions. As a result, obtained voltage was 0.27 mV.

Example 11

There was produced a thermoelectric conversion element of Example 11 having the same structure as that of Example 10 except that the number of stacked layers was 10, and voltage was measured in the same conditions. As a result, obtained voltage was 0.54 mV, which was about double the voltage obtained in Example 10.

Example 12

There was produced a thermoelectric conversion element of Example 12 that has the same structure as that of Example 10 except that the number of stacked layers was 15, and voltage was measured in the same conditions. As a result, obtained voltage was 0.81 mV, which was about three times the voltage obtained in Example 10.

REFERENCE SIGNS LIST 1, 2 thermoelectric conversion element
3 substrate
10 stacked structure
11-15 insulating layer
21-24 filler
31, 32 heat equalizing layer
33 solder
41-43 connection line
51-54, 61-63 wiring layer
E1, E2 terminal electrode
F heat flow
H through hole
L1-L3 linear pattern
P1-P3 land pattern
S1-S4, Sa, Sb spiral pattern
SL1, SL2 slit
V1-V5 via

What is claimed is:

1. A thermoelectric conversion element comprising a thermoelectric material which is annularly wound and radially magnetized to generate an electromotive force in a circumferential direction by a temperature gradient in an axial direction,
   wherein the thermoelectric material constitutes first and second spiral turns which are coaxially stacked and wound in opposite directions, and
   wherein an inner circumferential end of the first spiral turn is connected to an inner circumferential end of the second spiral turn.

2. The thermoelectric conversion element as claimed in claim 1, further comprising a filler filled between the thermoelectric materials adjacent in the magnetization direction, the filler having an insulation property, and lower in heat conductivity than the thermoelectric material.

3. The thermoelectric conversion element as claimed in claim 2, wherein the heat conductivity of the filler is lower than that of an insulating layer supporting the thermoelectric material.

4. The thermoelectric conversion element as claimed in claim 3, wherein, assuming that the heat conductivity of the thermoelectric material is "a", and the heat conductivity of the insulating layer is "b", b≥0.8a is satisfied.

5. The thermoelectric conversion element as claimed in claim 3, further comprising first and second heat equalizing layers that are provided so as to sandwich the thermoelectric material in the temperature gradient direction and have a heat conductivity higher than that of the insulating layer.

6. The thermoelectric conversion element as claimed in claim 1, wherein the thermoelectric material is made of a material having a Weyl point in a vicinity of Fermi energy and exhibiting an anomalous Nernst effect.

7. The thermoelectric conversion element as claimed in claim 1, further comprising first and second terminal electrodes connected to one end and other end of the thermoelectric material in the electromotive force direction.

8. A thermoelectric conversion device comprising:
   a substrate having first and second wiring patterns; and
   the thermoelectric conversion element as claimed in claim 7,
   wherein the first and second wiring patterns are connected respectively to the first and second terminal electrodes.

9. The thermoelectric conversion element as claimed in claim 4, further comprising first and second heat equalizing layers that are provided so as to sandwich the thermoelectric material in the temperature gradient direction and have a heat conductivity higher than that of the insulating layer.

* * * * *